United States Patent
Tsai et al.

(10) Patent No.: US 6,910,176 B2
(45) Date of Patent: Jun. 21, 2005

(54) METHOD FOR COMMUNICATING DATA BETWEEN DIGITAL CAMERA AND PORTABLE ELECTRONIC COMMUNICATION DEVICE

(75) Inventors: Tony Tsai, Taipei Hsieng (TW); Wei Han, Shanghai (CN)

(73) Assignee: Inventec Appliances Corp., Taipei Hsieng (TW)

( * ) Notice: Subject to any disclaimer, the term of this patent is extended or adjusted under 35 U.S.C. 154(b) by 564 days.

(21) Appl. No.: 10/155,063

(22) Filed: May 28, 2002

(65) Prior Publication Data

US 2003/0226099 A1 Dec. 4, 2003

(51) Int. Cl.$^7$ .............................................. H03M 13/00
(52) U.S. Cl. ...................... 714/777; 714/799; 455/423
(58) Field of Search ................................. 714/776, 746, 714/799, 800; 455/423, 426.1; 348/156

(56) References Cited

U.S. PATENT DOCUMENTS 4,507,782 A * 3/1985 Kunimasa et al. .......... 714/748
6,498,598 B2 * 12/2002 Watanabe .................... 345/156
6,646,677 B2 * 11/2003 Noro et al. ................. 348/156

* cited by examiner

Primary Examiner—Phung My Chung
(74) Attorney, Agent, or Firm—Bacon & Thomas PLLC

(57) ABSTRACT

The invention is to provide a method for communicating data between a digital camera and a portable electronic communication device comprising the processes of transmitting an instruction packet created by the electronic communication device to the digital camera for storage by means of a defined image data protocol; converting image data stored in the digital camera into at least one reply packet based on the instruction packet by performing the image data protocol by the digital camera and transmitting the reply packet back to the electronic communication device; and performing an error checking on at least one check field of the reply packet by the electronic communication device by means of the image data protocol so as to ensure that no erroneous image data being received.

12 Claims, 3 Drawing Sheets

METHOD FOR COMMUNICATING DATA BETWEEN DIGITAL CAMERA AND PORTABLE ELECTRONIC COMMUNICATION DEVICE

FIELD OF THE INVENTION

The present invention relates to data communication and more particularly to an improved method for communicating data between a digital camera and a portable electronic communication device.

BACKGROUND OF THE INVENTION

Information technology have known a rapid and a spectacular development leading to an increasing use of electronics and telecommunications. For example, cellular phones have been popular worldwide due to its portability and inexpensive unit price as a communication device. Recently, there is a trend of developing slim cellular phones among cellular phone manufacturers. Further, the functions of a cellular phone may incorporate features of many consumer electronic products to form a multifunctional cellular phone. For example, a user may set a number of short messages or data for transmission or receiving in advance. Thus, in addition to typical phone call, user can communicate with other persons anywhere in the world by means of cellular phone. Hence, it is very convenient.

Currently, transmission bandwidth of typical cellular phone is in a range of narrow frequency. As such, a relatively large data is susceptible to error during transmission or receiving due to interference of internal electronic elements or external signals. This is particularly serious because there is no check mechanism for signal encoding during data transmission or receiving process. In addition, it is readily known that a data communication (including transmission and receiving) between conventional digital camera and computer is effected by a high-capacity cable. Hence, data is free from above interference of internal electronic elements or external signals. As a result, both data transmission and receiving are stably performed. Accordingly, even there is no provision of check mechanism for signal encoding while performing a data communication between digital camera and computer, several tens or even up to several hundreds of K Bytes data are capable of being communicated.

It is also known above high-capacity communication technique implemented between typical digital camera and computer is not applicable to typical cellular phone. Hence, it is desirable to solve above problem as experienced by digital camera and cellular phone in order to increase image data receiving capability of digital camera and thus effecting a multifunctional cellular phone.

SUMMARY OF THE INVENTION

It is therefore an object of the present invention to provide a method for communicating data between a digital camera and a portable electronic communication device comprising the steps of transmitting an instruction packet created by the electronic communication device to the digital camera for storage by means of a defined image data protocol; converting image data stored in the digital camera into at least one reply packet based on the instruction packet by performing the image data protocol by the digital camera and transmitting the reply packet back to the electronic communication device; and performing an error checking on at least one check field of the reply packet by the electronic communication device by means of the image data protocol so as to ensure that no erroneous image data transmitted from the digital camera is received by the electronic communication device.

In one aspect of the present invention, a check field is provided in the instruction packet or the reply packet for checking a correctness of each packet. The check field comprises a length of data field for storing a length of data contained in the data field, a summation of data field for storing a sum of data contained in the data field, and a summation of packet header field for storing a sum of values of fields in the header of the packet, the sum being used as a field value for checking the packet. The method further comprises the steps of commanding the electronic communication device or the digital camera to check the fields contained in the check field for determining whether there is any error occurred with respect to content of the instruction packet or the reply packet during transmission; issuing an instruction to the corresponding digital camera or the electronic communication device requesting a re-transmission of the packet if there is an inconsistency between one of the field values contained in the check field and the received data in the instruction packet or the reply packet; and repeating the issuing step until there is no inconsistency between the field values contained in the check field and the received data in the instruction packet or the reply packet, thereby ensuring that no erroneous image data transmitted from the digital camera is received by the electronic communication device.

In another aspect of the present invention, prior to receiving image data of the digital camera by the electronic communication device, image data previously stored in a buffer of the electronic communication device is cleared, in response, the electronic communication device begins to receive image data transmitted from the digital camera, carries out a check mechanism for encoding to check data contained in the buffer for determining whether data consists of a plurality of identical encoded values, and if the determination is positive, it means that data content is erroneous in response, the electronic communication device repeatedly issues an instruction packet to the digital camera requesting a re-transmission of image data until the electronic communication device determines that data does not consist of the plurality of identical encoded values, thereby ensuring that all received image data is correct.

The above and other objects, features and advantages of the present invention will become apparent from the following detailed description taken with the accompanying drawings.

DETAILED DESCRIPTION OF THE PREFERRED EMBODIMENTS

The invention is directed to a method for communicating data between a digital camera and a portable electronic communication device. The method comprises the steps of transmitting an instruction packet created by the electronic communication device to the digital camera for storage by means of a defined image data protocol; converting image data stored in the digital camera into at least one reply packet based on the instruction packet by performing the image data protocol by the digital camera; transmitting the reply packet back to the electronic communication device; and performing an error checking on at least one check field of the reply packet by the electronic communication device by means of the image data protocol so as to ensure that no erroneous image data transmitted from the digital camera is received by the electronic communication device. By utilizing this method, it is possible of preventing error from occurring during image data transmission process. Otherwise, image data received by the digital camera may not be shown correctly on the electronic communication device.

Figure 1:
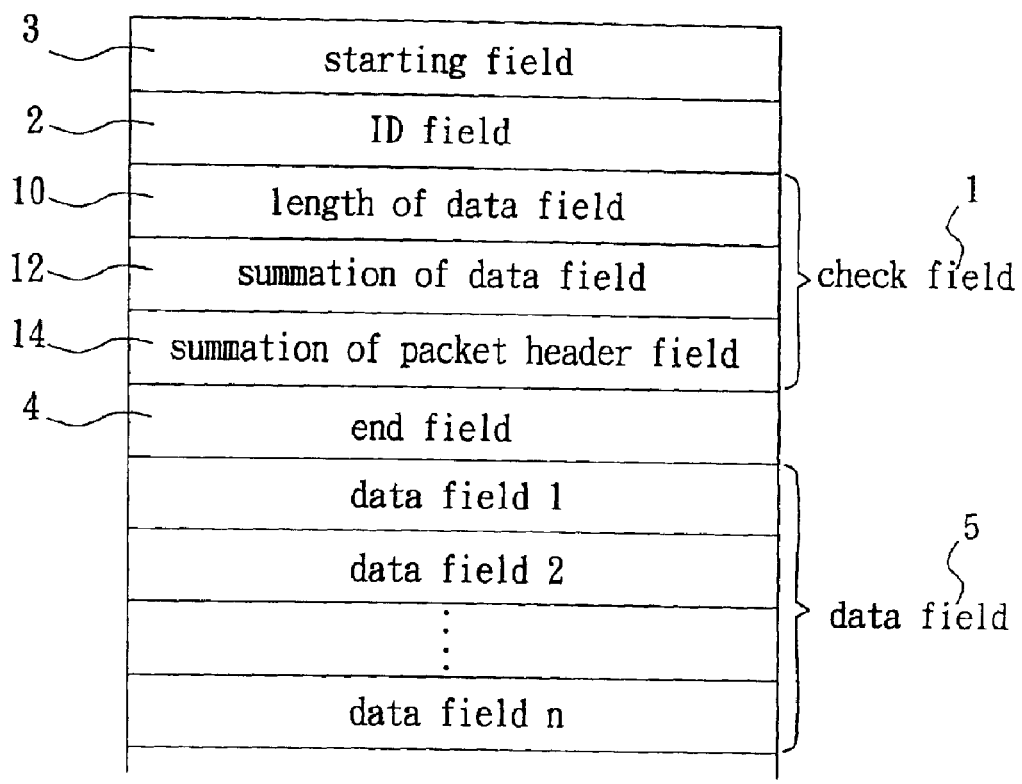
FIG. 1 is a graph showing a structure of either instruction packet or reply packet according to the invention.

Referring to FIG. 1, there is shown a graph of a structure of either instruction packet or reply packet defined by an image data protocol according to the invention. The instruction packet or reply packet comprises the following fields:

(1) Starting field 3: It may store a starting address of packet. Once digital camera or electronic communication device read the packet by performing image data protocol, it is possible of determining the starting address of packet based on a field value contained in starting field 3.

(2) Identification (ID) field 2: It may store an ID of digital camera or electronic communication device. Once digital camera or electronic communication device read the packet by performing image data protocol, it is possible of determining whether the packet is transmitted from the compatible digital camera or electronic communication device based on field value contained in identification field 2.

(3) Check field 1: It may store a check parameter for checking whether the packet is correct. Check field 1 comprises the following three fields:

a) Length of data field 10: It may store a length of data contained in data field 5.

b) Summation of data field 12: It may store a sum of data contained in data field 5.

c) Summation of packet header field 14: It may store a sum of values of fields in packet header. The sum is used as a field value for checking the packet. The fields in packet header comprise ID field 2, length of data field 10, and summation of data field 12. As to instruction packet, in addition to above fields, packet header further comprises at least one parameter field (not shown) associated with an issued instruction.

(4) End field 4: It may store an end address of packet header. Once digital camera or electronic communication device read the packet by performing image data protocol, it is possible of determining the end address of packet based on field value contained in end field 4.

(5) Data field 5: It may store data (e.g., image data and associated information) being transmitted. Data is divided into a number of blocks which are sequentially stored in a plurality of fields of data field 5.

In the invention, once digital camera received an instruction packet from electronic communication device, the digital camera may sequentially perform a signal test instruction, a file transmission instruction, and an image data instruction. A packet defined by image data protocol is commanded to process a reply packet created by the signal test instruction in order to transmit the reply packet to the electronic communication device. Hence, the electronic communication device may maintain a normal communication with digital camera. Then process a reply packet created by file transmission instruction prior to transmitting reply packet to the electronic communication device. Thus, electronic communication device may receive an image data transmitted from digital camera. Next, process a reply packet created by image data instruction prior to transmitting the reply packet to the electronic communication device. As a result, electronic communication device can ascertain information (e.g., width and height of image, etc.) associated with the received image data.

In general, an error occurred during a wireless transmission is either data lost error or data content error. Hence, the possibility of error occurring during data transmission may be reduced to a minimum if above two types of errors can be effectively avoided in advance. A solution to above errors is proposed by the invention. In detail, the invention comprises the steps of (a) commanding electronic communication device or digital camera to check fields contained in check field for determining whether there is any error occurred with respect to content of instruction packet or reply packet during transmission; (b) issuing an instruction to the corresponding digital camera or electronic communication device requesting a re-transmission of the packet if there is any inconsistency between field value contained in check field and received packet data; and (c) repeating step (b) until there is no inconsistency between field value contained in check field and received packet data. As a result, it is possible of ensuring that no erroneous image data transmitted from the digital camera is received by the electronic communication device.

Generally speaking, image data of digital camera comprises a plurality of digital signals having values of 0 or 1. In one undesired condition, all digital signals have values of 0 or 1. Also, a number of picture-taking modes are implemented by a digital camera. As such, a user may use one of picture-taking modes for taking a picture on an object depending on status of picture-taking so as to obtain an optimum digital data. In a normal condition, a situation that digital image data taken by digital camera consisting of 0s or 1s is not possible.

In the invention, a solution is proposed for eliminating above data transmission error. Prior to receiving image data of digital camera by electronic communication device, image data previously stored in a buffer of electronic communication device is cleared. Then electronic communication device begins to receive image data transmitted from digital camera. Next, a check mechanism for encoding is carried out to check data contained in buffer so as to determine whether data consists of a plurality of identical encoded values. If yes, it means that data content is erroneous. Next, electronic communication device issues an instruction packet to the digital camera requesting a re-transmission of image data. Above re-transmission is repeated until electronic communication device determines that data does not consist of the plurality of identical encoded values. At this time, it is ensured that all received image data is correct. Eventually, the correct image data is shown on a display of electronic communication device.

Figure 2:
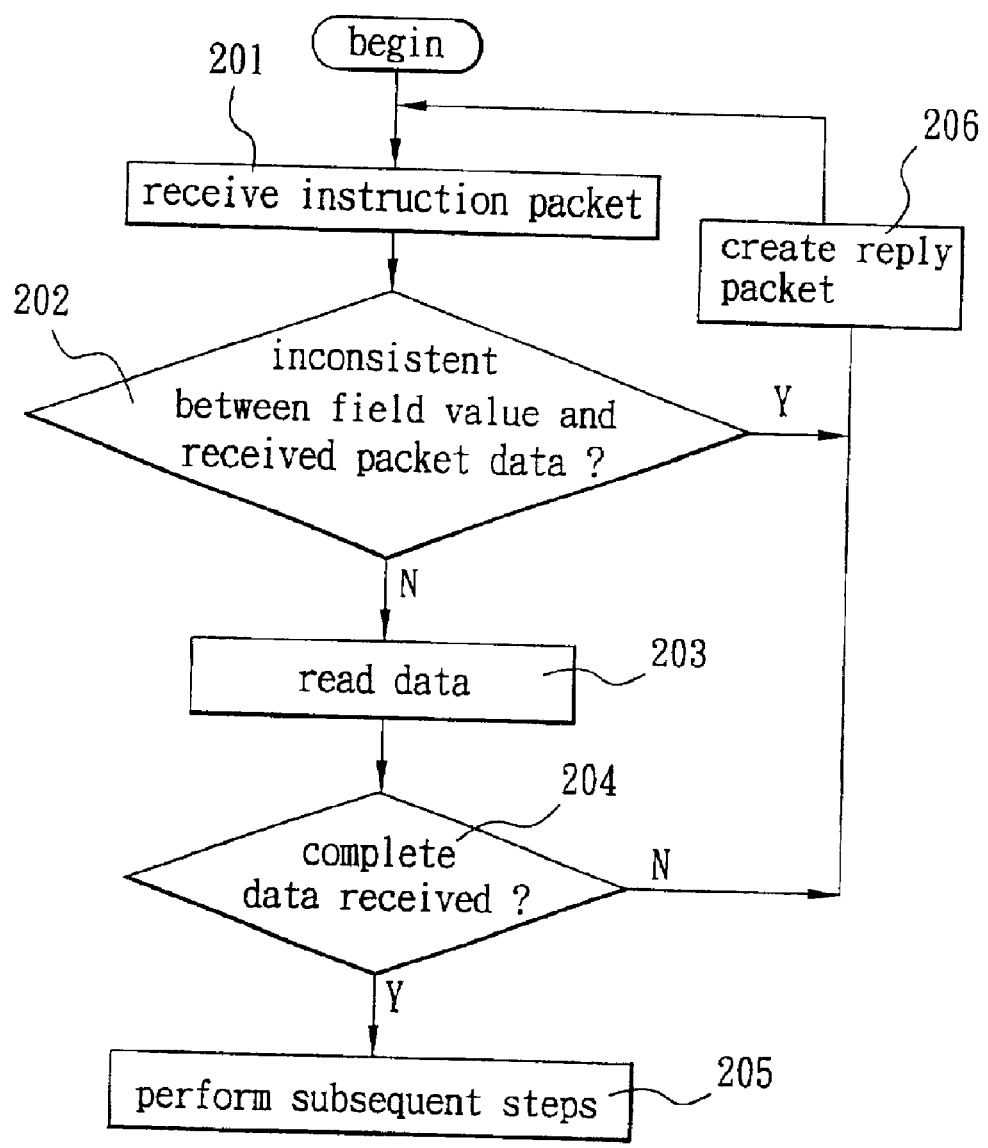
FIG. 2 is a flow chart illustrating a checking process of receiving instruction packet transmitted from electronic communication device by digital camera according to the invention.

Referring to FIG. 2, there is shown a flow chart illustrating a checking process of receiving instruction packet transmitted from electronic communication device by digital camera according to the invention. Following are steps performed by digital camera:

Step 201: First reads field value contained in check field of instruction packet transmitted from electronic communication device.

Step 202: Next, it is determined whether there is any inconsistency between field value contained in check field and received packet data. If not, the process goes to step 203. Otherwise, the process jumps to step 206.

Step 203: Reads data contained in instruction packet.

Step 204: It is determined whether a complete data is received. If yes, the process goes to step 205. Otherwise, the process jumps to step 206.

Step 205: Perform subsequent steps based on instruction contained in data.

Step 206: Create a reply packet requesting a re-transmission of instruction packet from electronic communication device. The process then loops back to step 201 for continuation until it is ensured that received instruction packet is correct.

Figure 3:
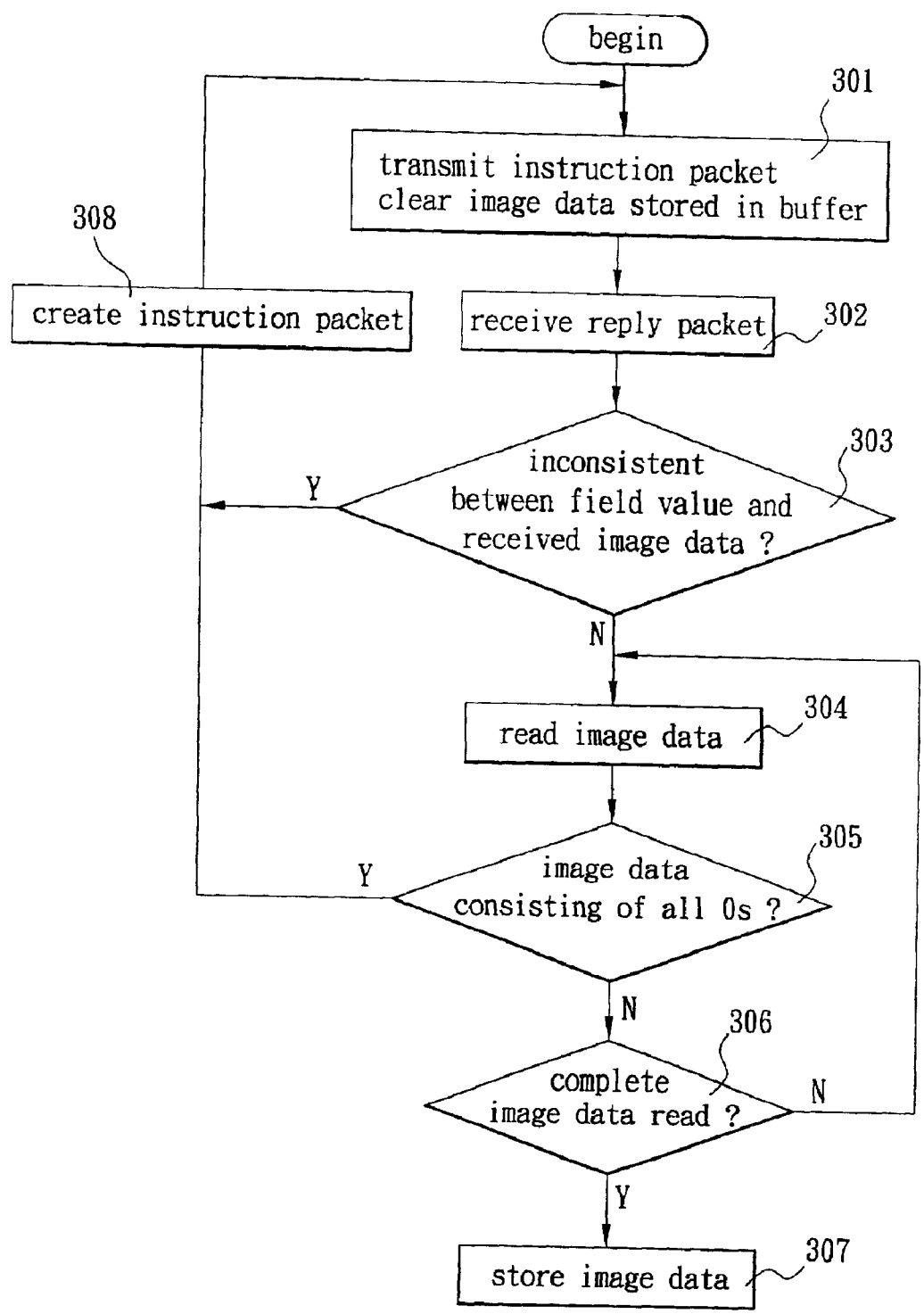
FIG. 3 is a flow chart illustrating a checking process of receiving image data transmitted from digital camera by electronic communication device according to the invention.

Referring to FIG. 3, there is shown a flow chart illustrating a checking process of receiving image data transmitted from digital camera by electronic communication device according to the invention. Following are steps performed by electronic communication device:

Step 301: First, electronic communication device transmits an instruction packet to digital camera for requesting it to clear image data previously stored in buffer of the digital camera in response to an image data transmission by digital camera.

Step 302: Next, receive reply packet transmitted from digital camera prior to reading field values contained in check field of reply packet.

Step 303: It is determined whether there is any inconsistency between field value contained in check field and received packet image data. If not, the process goes to step 304. Otherwise, the process jumps to step 308.

Step 304: Reads image data contained in reply packet.

Step 305: It is determined whether image data consists of all 0s. If not (i.e., not all are 0s), the process goes to step 306. Otherwise, the process jumps to step 308.

Step 306: It is determined whether a complete image data has been read. If yes, the process goes to step 307. Otherwise, the process loops back to step 304.

Step 307: Store image data in a memory of portable electronic communication device.

Step 308: Create an instruction packet requesting a re-transmission of reply packet from digital camera. The process then loops back to step 301 for continuation until it is ensured that image data received from digital camera is correct.

While the invention has been described by means of specific embodiments, numerous modifications and variations could be made thereto by those skilled in the art without departing from the scope and spirit of the invention set forth in the claims.

What is claimed is:

1. A method for communicating data between a digital camera and a portable electronic communication device comprising the steps of:

transmitting an instruction packet created by the electronic communication device to the digital camera for storage by means of a defined image data protocol;

converting image data stored in the digital camera into at least one reply packet based on the instruction packet by performing the image data protocol by the digital camera, and transmitting the reply packet back to the electronic communication device; and performing an error checking on at least one check field of the reply packet by the electronic communication device by means of the image data protocol so as to ensure that no erroneous image data transmitted from the digital camera is received by the electronic communication device.

2. The method of claim 1, wherein the packet defined by the image data protocol comprises:

a starting field for storing a starting address of the packet, which is used to determine the starting address of the packet based on a field value contained in the starting field while the digital camera or the electronic communication device read the packet by performing the image data protocol;

an identification (ID) field for storing an ID of the digital camera or the electronic communication device, which is used to determine whether the packet is transmitted from the compatible digital camera or the electronic communication device based on a field value contained in the ID field while the electronic communication device or the digital camera read the packet by performing the image data protocol;

a check field for storing a check parameter for checking whether the packet is correct;

an end field for storing an end address of the packet, which is used to determine the end address of the packet based on a field value contained in the end field while the digital camera or the electronic communication device read the packet by performing image data protocol; and a plurality of data fields for storing data being transmitted wherein data is divided into a plurality of blocks being sequentially stored in the data fields.

3. The method of claim 2, wherein the check field comprises:

a length of data field for storing a length of data contained in the data field;

a summation of data field for storing a sum of data contained in the data field; and a summation of packet header field for storing a sum of values of fields in the header of the packet, the sum being used as a field value for checking the packet wherein the header of the packet comprise the ID field, the length of data field, and the summation of data field.

4. The method of claim 3, wherein the header of the packet further comprises at least one parameter field associated with an issued instruction.

5. The method of claim 1, while the digital camera received the instruction packet from the electronic communication device, the digital camera is capable of performing the following instruction:

a signal test instruction, wherein a reply packet created by executing the signal test instruction is transmitted to the electronic communication device by means of the instruction packet defined by the image data protocol so that the electronic communication device is capable of maintaining a normal communication with the digital camera;

a file transmission instruction, wherein a reply packet created by executing the file transmission instruction is transmitted to the electronic communication device by means of the instruction packet defined by the image data protocol so that the electronic communication device is capable of receiving an image data transmitted from the digital camera; and an image data instruction, wherein a reply packet created by executing the image data instruction packet is transmitted to the electronic communication device by means of the instruction packet defined by the image data protocol so that the electronic communication device is capable of ascertaining information associated with the received image data.

6. The method of claim 1, further comprising the processes of:

commanding the electronic communication device or the digital camera to check the fields contained in the check field for determining whether there is any error occurred with respect to the content of the instruction packet or the reply packet during transmission;

issuing an instruction to the corresponding the electronic communication device or digital camera requesting a re-transmission of the packet if there is an inconsistency between one of the field values contained in the check field and the received data in the instruction packet or the reply packet; and repeating the issuing step until there is no inconsistency between the field values contained in the check field and the received data in the instruction packet or the reply packet, thereby ensuring that no erroneous image data transmitted from the digital camera is received by the electronic communication device.

7. The method of claim 1, wherein prior to receiving image data of the digital camera by the electronic communication device, image data previously stored in a buffer of the electronic communication device is cleared, in response, the electronic communication device begins to receive image data transmitted from the digital camera, carries out a check mechanism for encoding to check data contained in the buffer for determining whether data consists of a plurality of identical encoded values, and if the determination is positive, it means that data content is erroneous in response, the electronic communication device repeatedly issues an instruction packet to the digital camera requesting a re-transmission of image data until the electronic communication device determines that data does not consist of the plurality of identical encoded values, thereby ensuring that all received image data is correct.

8. The method of claim 1, wherein a checking process of receiving an instruction packet transmitted from the electronic communication device by the digital camera comprises the steps of:

(a) reading the field value contained in the check field of the instruction packet transmitted from the electronic communication device;

(b) determining whether there is an inconsistency between one of the field values contained in the check field and the received data in the instruction packet;

(c) if the determination in step (b) is negative, reading data contained in the instruction packet;

(d) determining whether a complete data is received; and (e) if the determination in step (d) is positive, performing a subsequent processing based on an instruction contained in data of the instruction packet.

9. The method of claim 8, wherein if the determination in step (b) is positive or if the determination in step (d) is negative, creating a reply packet requesting a re-transmission of the instruction packet from the electronic communication device by the digital camera and looping back to step (a) for continuation until it is ensured that the received instruction packet is correct.

10. The method of claim 1, wherein a checking process of receiving image data transmitted from the digital camera by the electronic communication device comprises the steps of:

(f) commanding the electronic communication device to transmit an instruction packet to the digital camera for requesting it to clear image data previously stored in a buffer of the digital camera in response to an image data transmission by the digital camera;

(g) receiving the reply packet transmitted from the digital camera prior to reading the field value contained in the check field of the reply packet;

(h) determining whether there is an inconsistency between one of the field value contained in the check field of the reply packet and the received data in the reply packet;

(i) if the determination in step (h) is negative, reading image data contained in the reply packet;

(j) determining whether image data consists of a plurality of identical encoded values;

(k) if the determination in step (j) is negative, determining whether a complete image data has been read; and (l) if the determination in step (k) is positive, storing image data in a memory of the electronic communication device.

11. The method of claim 10, wherein if the determination in step (k) is negative, the method loops back to step (i) for reading image data contained in the reply packet.

12. The method of claim 11, wherein if the determination in step (h) is positive or if the determination in step (j) is positive, creating an instruction packet requesting a re-transmission of the reply packet from the digital camera by the electronic communication device and looping back to step (f) for continuation until it is ensured that image data received from the digital camera is correct.

* * * * *